United States Patent
Durgin et al.

(10) Patent No.: US 9,558,975 B2
(45) Date of Patent: Jan. 31, 2017

(54) SYSTEM AND METHOD FOR TRANSFERRING ARTICLES BETWEEN VACUUM AND NON-VACUUM ENVIRONMENTS

(71) Applicant: Varian Semiconductor Equipment Associates, Inc., Gloucester, MA (US)

(72) Inventors: Sheri A. Durgin, Woburn, MA (US); Stacia L. Marcelynas, Amesbury, MA (US); Fletcher I. Potter, Beverly, MA (US); Daniel L. Goodwin, Beverly, MA (US); Omar S. Kiyani, Cambridge, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 503 days.

(21) Appl. No.: 14/032,456

(22) Filed: Sep. 20, 2013

(65) Prior Publication Data
US 2015/0086300 A1 Mar. 26, 2015

(51) Int. Cl.
*H01L 21/677* (2006.01)
*H01L 21/67* (2006.01)

(52) U.S. Cl.
CPC ..... *H01L 21/67201* (2013.01); *H01L 21/6779* (2013.01); *H01L 21/67748* (2013.01)

(58) Field of Classification Search
CPC .................................................. H01L 21/67739
USPC .............................................. 414/217, 217.1
See application file for complete search history.

(56) References Cited

U.S. PATENT DOCUMENTS

| | | | | |
|---|---|---|---|---|
| 6,196,154 | B1 * | 3/2001 | Baumecker | C23C 14/56 118/718 |
| 7,220,055 | B2 * | 5/2007 | Hertel | F16C 32/0651 384/119 |
| 7,232,286 | B2 * | 6/2007 | Shinozaki | F16J 15/406 118/719 |
| 7,394,076 | B2 | 7/2008 | Devitt | |
| 7,452,174 | B2 * | 11/2008 | Lee | H01L 21/67196 414/217 |
| 2009/0163040 | A1 * | 6/2009 | Maeda | C23C 16/455 438/791 |
| 2009/0229634 | A1 * | 9/2009 | Nomura | H01L 21/67276 134/18 |
| 2010/0190343 | A1 * | 7/2010 | Aggarwal | C30B 25/16 438/694 |

(Continued)

*Primary Examiner* — James Keenan

(57) ABSTRACT

A system for transferring articles between an atmospheric pressure environment and a vacuum pressure environment. The system may include a vacuum enclosure having a wall separating the atmospheric pressure environment from the vacuum pressure environment. A transfer shaft may extend through the wall from the atmospheric pressure environment to the vacuum pressure environment. The transfer shaft may include an atmospheric transfer port disposed within the atmospheric pressure environment, a vacuum transfer port disposed within the vacuum pressure environment, and an intermediate port disposed adjacent a channel in the wall. The system may further include a movable transfer carriage disposed within the transfer shaft, the transfer carriage having an access port for providing access to an interior of the transfer carriage. The system may further include an air bearing on the transfer carriage configured to expel gas for maintaining a gap between the transfer carriage and the transfer shaft.

14 Claims, 9 Drawing Sheets

(56) References Cited

U.S. PATENT DOCUMENTS

2015/0125239 A1\* 5/2015 Roub ............... H01L 21/67748
 414/219

\* cited by examiner

SYSTEM AND METHOD FOR TRANSFERRING ARTICLES BETWEEN VACUUM AND NON-VACUUM ENVIRONMENTS

FIELD OF THE DISCLOSURE

The disclosure relates generally to the field of semiconductor device fabrication, and more particularly to a device and method for moving semiconductor workpieces into and out of a vacuum environment.

BACKGROUND OF THE DISCLOSURE

Ion implantation is a technique for introducing conductivity-altering impurities into semiconductor workpieces. During ion implantation, a desired impurity material is ionized in an ion source chamber, the ions are accelerated to form an ion beam of prescribed energy, and the ion beam is focused and directed toward the surface of a workpiece positioned in a process chamber. The energetic ions in the ion beam penetrate into the bulk of the workpiece material and are embedded into the crystalline lattice of the material to form a region of desired conductivity.

Semiconductor workpieces are highly susceptible to particulate contamination that can detrimentally alter the conductivity characteristics of a workpiece. In order to mitigate such contamination, ion implantation is typically performed in high vacuum pressure environments. It is therefore necessary to employ transfer devices for moving workpieces into and out of such vacuum environments in an expeditious manner while simultaneously minimizing the creation and transmission of particulate matter.

Traditional batch-transfer load-lock systems for moving semiconductor workpieces into and out of vacuum environments typically include one or more load-locks that are each configured to receive one or more workpieces at a time. In some embodiments, a cassette of vertically-stacked semiconductor workpieces is transferred into a load lock from a side of the load-lock that is exposed to an atmospheric pressure environment. After the stack of workpieces has been loaded into a load-lock from the atmospheric side, the load-lock is sealed and an interior of the load-lock is pumped down to vacuum pressure. A side of the load-lock that is exposed to a high vacuum pressure processing environment is then opened and one or more of the workpieces in the stack are collected for subsequent transfer to an ion implanter. After the workpieces have been implanted, the above-described transfer process is performed in reverse to move the workpieces back to the atmospheric pressure environment where they may be collected for further processing.

A problem that is associated with traditional batch-transfer load-lock systems of the type described above is that semiconductor workpieces may be exposed to different amounts of particulate depending on their respective positions within a stack. For example, a workpiece that is at a top position in a stack may gather a greater amount of particulate than workpieces at lower positions within the stack that are shielded by workpieces at higher positions. This may result in uneven particulate contamination between workpieces, and therefore inconsistent conductivity characteristics, within a batch of semiconductor workpieces handled by a particular load-lock.

SUMMARY

In view of the foregoing, it would be advantageous to provide a system and method for transferring articles into and out of a vacuum pressure environment in a sequential manner under substantially identical conditions, including article position and exposure to contaminants, during transfer. Moreover, it would be advantageous to provide such a system and method that minimize the presence of contaminants to which transferred articles are exposed.

An exemplary system for transferring articles between an atmospheric pressure environment and a vacuum pressure environment in accordance with the present disclosure may include a vacuum enclosure having a wall separating the atmospheric pressure environment from the vacuum pressure environment, and a transfer shaft extending through the wall from the atmospheric pressure environment to the vacuum pressure environment. The transfer shaft may include an atmospheric transfer port disposed within the atmospheric pressure environment, a vacuum transfer port disposed within the vacuum pressure environment, and an intermediate port disposed adjacent a channel in the wall. The system may further include a movable transfer carriage disposed within the transfer shaft, the transfer carriage having an access port for providing access to an interior of the transfer carriage. The system may further include an air bearing mounted to the transfer carriage that is configured to expel pressurized gas for maintaining a gap between the transfer carriage and the transfer shaft.

Another exemplary system for transferring articles between an atmospheric pressure environment and a vacuum pressure environment may include a transfer shaft extending between the atmospheric pressure environment and the vacuum pressure environment, a movable transfer carriage disposed within the transfer shaft, the transfer carriage having an access port for providing access to an interior of the transfer carriage, and an air bearing mounted to the transfer carriage and configured to expel pressurized gas for maintaining a gap between the transfer carriage and the transfer shaft.

An exemplary method for transferring an article between an atmospheric pressure environment and a vacuum pressure environment in accordance with the present disclosure may include transferring the article into a transfer carriage, moving the transfer carriage through a transfer shaft, expelling gas from an air bearing mounted to the transfer carriage for maintaining a gas-filled gap between the transfer carriage and the transfer shaft, and transferring the article out of the transfer carriage.

An exemplary method for transferring an article disposed in a transfer carriage through a transfer shaft between an atmospheric pressure environment and a vacuum pressure environment in accordance with the present disclosure may include expelling gas from an air bearing mounted to the transfer carriage for maintaining a gas-filled gap between the transfer carriage and the transfer shaft, and drawing gas out of the transfer shaft through a differential pumping region in the transfer carriage.

DETAILED DESCRIPTION

Figure 1:
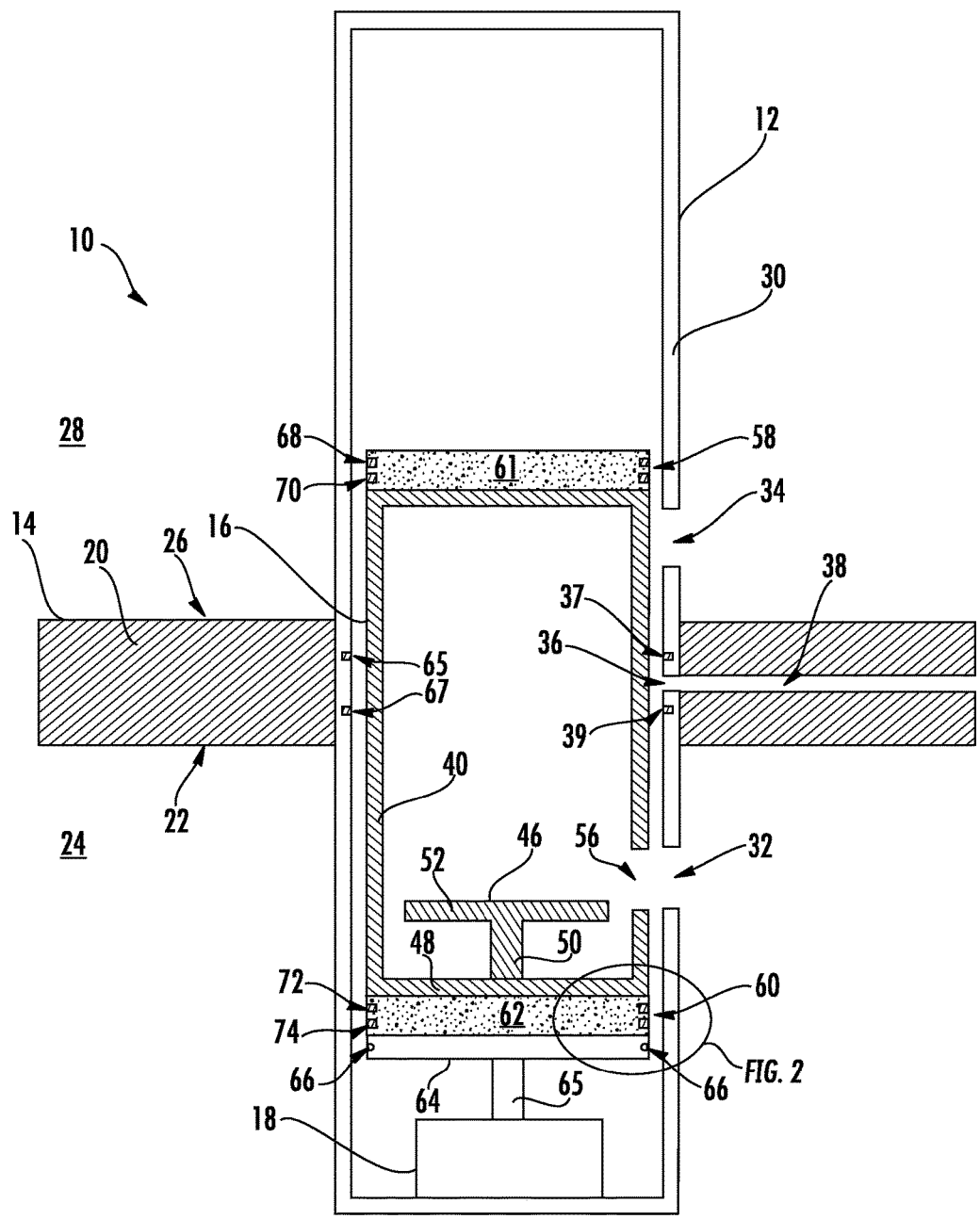
FIG. 1 is a view in section illustrating an exemplary vacuum transfer system in accordance with the present disclosure.

A system and method in accordance with the present disclosure will now be described more fully hereinafter with reference to the accompanying drawings, in which preferred embodiments of the system and method are shown. The system and method, however, may be embodied in many different forms and should not be construed as being limited to the embodiments set forth herein. Rather, these embodiments are provided so that this disclosure will be thorough and complete, and will fully convey the scope of the system and method to those skilled in the art. In the drawings, like numbers refer to like elements throughout.

Figure 2:
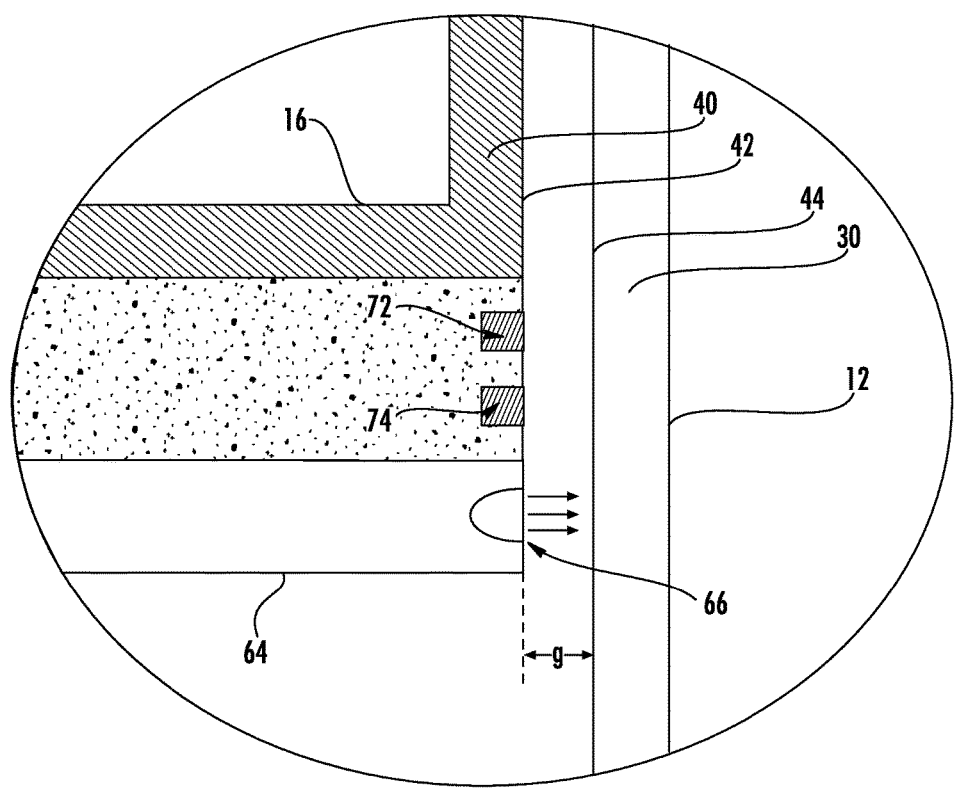
FIG. 2 is a detailed view in section illustrating an interface portion of the exemplary vacuum transfer system shown in FIG. 1.

Referring to FIGS. 1 and 2, an exemplary embodiment of a system 10 for transferring articles into and out of a vacuum environment in accordance with the present disclosure is shown. The exemplary system 10 is described herein as being used for transferring semiconductor substrates between an atmospheric side and a vacuum side of an ion implanter system. However, it will be appreciated by those of ordinary skill in the art that the system 10 may be similarly implemented in virtually any type of process or system in which articles are transferred between vacuum and non-vacuum environments. Such processes and systems include, but are not limited to, milling, deposition, etching, ashing, cleaning, lithography, and inspection. Other applications are contemplated and may be implemented without departing from the scope of the present disclosure.

The system 10 of the present disclosure may generally include a transfer shaft 12, a vacuum enclosure 14, a transfer carriage 16, and a linear actuator 18. For the sake of convenience and clarity, terms such as "top," "bottom," "upper," "lower," "vertical," "horizontal," "lateral," and "longitudinal" will be used herein to describe the relative placement and orientation of these components and their constituent parts, each with respect to the geometry and orientation of the system 10 as it appears in FIG. 1. Said terminology will include the words specifically mentioned, derivatives thereof, and words of similar import.

The transfer shaft 12 of the system 10 may be a substantially hollow, vertically-oriented enclosure that extends through a wall 20 of the vacuum enclosure 14. Particularly, the transfer shaft 12 may extend vertically from a distance below a lower, atmospheric side 22 of the wall 20 that is exposed to an atmospheric pressure environment 24 to a distance above an upper, vacuum side 26 of the wall 20 that is exposed to a high vacuum environment 28. In one non-limiting exemplary embodiment, the high vacuum environment 28 may be the interior of a load-lock of an ion implantation system, for example.

The transfer shaft 12 may be generally cylindrical with a circular horizontal cross-section, but this is not critical. The transfer shaft 12 may alternatively be formed with a variety of other cross-sectional shapes, including, but not limited to, rectangular, triangular, non-circular oval, oblong, and irregular. All such variations may be implemented without departing from the scope of the present disclosure and without substantially affecting the operation of the system 10 as described below.

A sidewall 30 of the transfer shaft 12 may include an atmospheric transfer port 32 located below the wall 20, within the atmospheric pressure environment 24. The sidewall 30 may further include a vacuum transfer port 34 located above the wall 20, within the high vacuum pressure environment 28. The sidewall 30 may additionally be provided with an intermediate port 36 that may be located intermediate the atmospheric side 22 and vacuum side 26 of the wall 20 and vertically aligned with a channel 38 that extends through the wall 20. As will be further described below, the channel 38 may be coupled to a pressurized air source and a vacuum source (not shown) for alternately evacuating and venting the transfer carriage 16 during operation of the system 10.

The atmospheric transfer port 32, vacuum transfer port 34, and intermediate port 36 are shown in FIG. 1 as being vertically aligned with one another, but this is not critical. For example, it is contemplated that the atmospheric transfer port 32 and vacuum transfer port 34 may alternatively be positioned diametrically opposite one another, or at various other degrees of relative circumferential offset, about a vertical axis of the transfer shaft 12.

The transfer shaft 12 may further include upper and lower differential pumping regions 37 and 39 disposed above and below the intermediate port 36, respectively. The specific structure and function of the differential pumping regions 37 and 39 will be described in greater detail below.

The transfer carriage 16 of the system 10 may be a cylindrical enclosure that is disposed within the transfer shaft 12 in a substantially axially-aligned relationship therewith. The transfer carriage 16 may have a cross-sectional shape that is substantially the same as the cross-sectional shape of the transfer shaft 12 and an exterior cross-sectional size that is slightly smaller than the interior cross-sectional size of the transfer shaft 12. FIG. 1 shows an enlarged space between the transfer carriage 16 and the transfer shaft 12 for purposes of illustration. In practical application, a sidewall 40 of the transfer carriage 16 may therefore be disposed in a continuous, close-clearance relationship with the sidewall 30 of the transfer shaft 12. For example, referring to FIG. 2, a gap "g" may separate the exterior surface 42 of the sidewall 40 from the interior surface 44 of the sidewall 30. In one non-limiting exemplary embodiment the gap "g" may be about 30 microns. An exemplary range for the width of the gap "g" may be about 1 micron to about 1 millimeter. Of course, the gap "g" may be made narrower or wider as desired without departing from the present disclosure.

The transfer carriage 16 may include a workpiece pedestal 46 that extends from a floor 48 of the transfer carriage 16 for supporting a semiconductor workpiece as further described below. The workpiece pedestal 46 is shown as having a stand 50 and a support surface 52 that define a T-shaped vertical cross-section. It will be appreciated, however, that this particular configuration is not critical, and it is contemplated that the workpiece pedestal 46 may have any size, shape, and configuration that are suitable for securely supporting a semiconductor workpiece during conveyance thereof, such as may be dictated by the particular type of workpiece to be supported and the particular processes that are to be performed on the workpiece. It is further contemplated that the workpiece pedestal may be entirely omitted, and that a semiconductor workpiece may be supported by the floor 48 of the transfer carriage.

The transfer carriage 16 may include an access port 56 formed in the sidewall 40 thereof. As will be described in greater detail later, the transfer carriage 16 can be movable within the transfer shaft 12 so that the access port 56 is selectively aligned with the atmospheric transfer port 32, vacuum transfer port 34, and intermediate port 36. Although a single access port 56 is illustrated, it is contemplated that the sidewall 40 of the transfer carriage 16 can include a plurality of access ports. For example, if two or more of the ports 32-36 of the transfer shaft 12 are positioned on opposing or different sides of the transfer shaft, the sidewall 40 may be provided with two or more access ports, where each access port is aligned with at least one of the ports 32-36.

The transfer carriage 16 may further include upper and lower differential pumping regions 58 and 60 disposed in upper and lower portions 61 and 62 of the transfer carriage 16, respectively. A cylindrical air bearing 64 may be positioned adjacent to the floor 48 of the transfer carriage 16. The specific structure and function of the differential pumping regions 58 and 60 and the air bearing 64 will be described in greater detail below.

Figure 4:
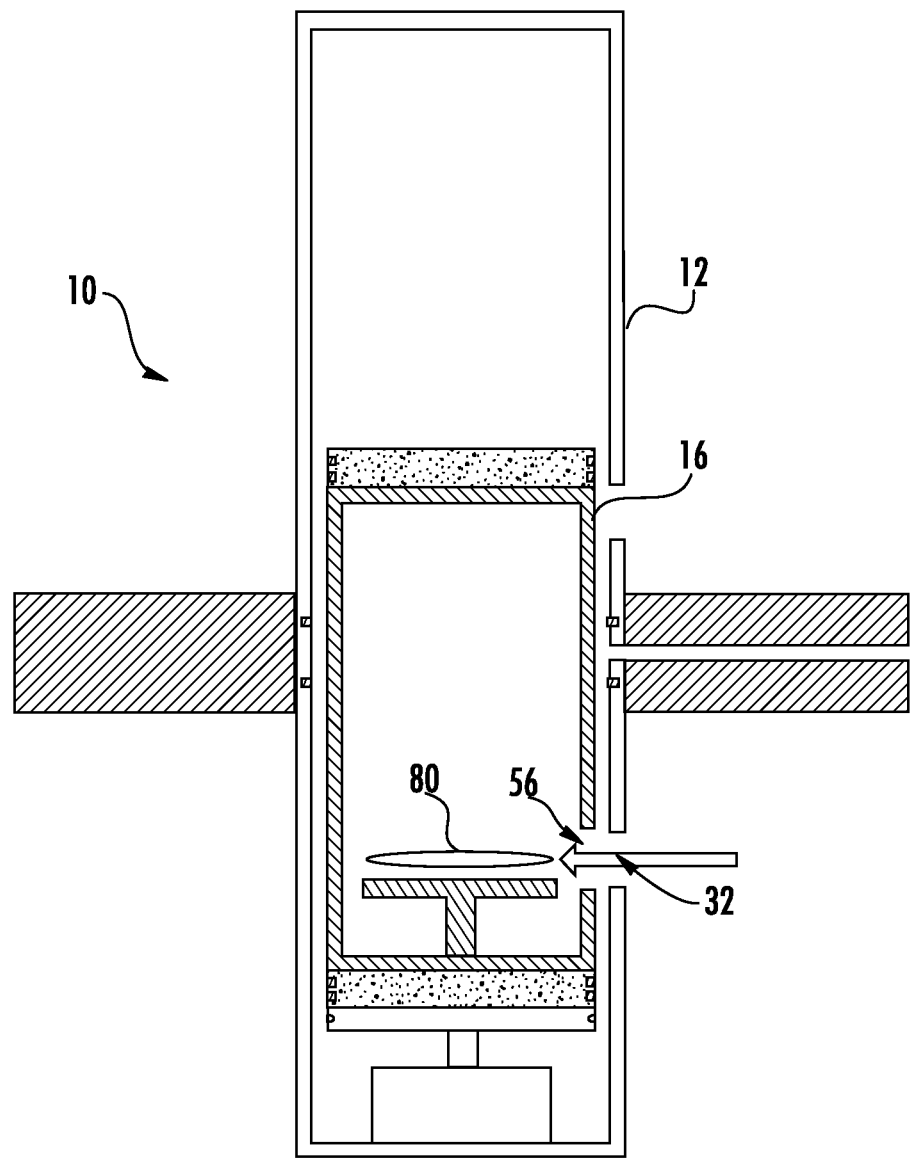
FIGS. 4-9 are a series of cross-sectional views illustrating the exemplary method set forth in FIG. 2 being performed using the exemplary vacuum transfer system shown in FIG. 1.

In the illustrated embodiment, the linear actuator 18 of the system 10 is disposed within the transfer shaft 12, below the transfer carriage 16. The linear actuator 18 may include a vertically-oriented, axially-extendable drive shaft or screw 65 that engages a bottom of the transfer carriage 16. During operation of the system 10, the linear actuator 18 may selectively cycle the transfer carriage 16 between several predetermined vertical positions within the transfer shaft 12. For example, such vertical positions may include an atmospheric position (shown in FIGS. 1, 4, and 9) wherein the access port 56 of the transfer carriage 16 is aligned with the atmospheric transfer port 32 of the transfer shaft 12, an intermediate position (shown in FIGS. 5 and 8) where the access port 56 of the transfer carriage 16 is aligned with the intermediate port 36 of the transfer shaft 12, and a vacuum position (shown in FIGS. 6 and 7) where the access port 56 of the transfer carriage 16 is aligned with the vacuum transfer port 34 of the transfer shaft 12.

During vertical travel of the transfer carriage 16, the air bearing 64 may center the transfer carriage 16 within the transfer shaft 12 and prevent the contact between the two. In operation, the air bearing 64 may expel pressurized air radially-outwardly, such as via circumferentially-spaced, radially outwardly-facing air outlets 66 (best shown in FIG. 2). The pressurized air may be supplied to the outlets 66 by one or more high pressure air sources (not shown) coupled thereto, for example. The air bearing 64 may thereby create a film of air that fills and maintains the gap "g" between the sidewall 40 of the transfer carriage and the sidewall 30 of the transfer shaft 12 as further described below. Thus, under normal operating conditions, no solid-to-solid contact between the transfer carriage 16 and the transfer shaft 12 occurs, thereby minimizing the generation of particulate contaminants that could otherwise be produced as a result of engagement between the transfer carriage 16 and the transfer shaft 12. It will be appreciated that the use of air is not critical, and that other gases can be similarly employed for filling and maintaining the air gap "g." In some embodiments, the air pressure produced by the air bearing 64 may be in the range of about 70 pounds per square inch (psi) to about 90 psi. Other values may of course be used, as desired for a particular application.

In some embodiments, the air bearing 64 may be formed of a material having a relatively low coefficient of friction, such as graphite. In a particular embodiment, the air bearing 64 may be formed of a piece of graphite with discrete openings formed therein for defining the air outlets 66. In another contemplated embodiment, the air bearing 64 may be formed of porous graphite, and pressurized air may be expelled from the air bearing 64 through naturally-occurring the pores in the material.

As described above, the interior of the vacuum enclosure 14 may be held under high vacuum conditions (e.g., $1\times10^{-5}$ to $1\times10^{-7}$ Torr), while conditions outside of the vacuum enclosure 14 may be at normal atmospheric pressure. Thus, the upper portion of the transfer shaft 12 adjacent the vacuum transfer port 34 may be subject to high vacuum conditions while the lower portion of the transfer shaft 12 adjacent the atmospheric transfer port 32 may be subject to normal atmospheric conditions. Due to the existence of such a high differential pressure within the transfer shaft 12, gases from the atmospheric pressure environment 24, from the air bearing 64, and from the intermediate port 36 may tend to migrate toward the vacuum enclosure 14. If such gases were allowed to enter the vacuum enclosure 14, they could cause contamination and adversely affect conditions within the vacuum enclosure 14. An appropriate sealing arrangement may, therefore, be employed to prevent gas from the atmospheric pressure environment 24 and the air bearing 64 from entering the vacuum enclosure 14.

To provide a seal against the ingress of air or other gases into the vacuum enclosure 14, the aforementioned differential pumping regions 37 and 39 may be provided in the sidewall 30 above and below the intermediate port 36, respectively, and the aforementioned differential pumping regions 58 and 60 may be provided in the upper and lower portions 60 and 62 of the transfer carriage 16, respectively. Each of the differential pumping regions 37 and 39 may include one or more grooves 65 and 67 formed in the interior surface of the sidewall 30, and each of the differential pumping regions 58 and 60 may include a plurality of grooves 68, 70, 72, and 74 formed in the exterior surfaces of the upper and lower portions 61 and 62. In the illustrated embodiment, each of the grooves 65 and 67 defines an annular channel in the interior of the transfer shaft 12, and each of the grooves 68-74 defines an annular channel in the exterior of the transfer carriage 16. Alternatively, the grooves 65-74 may not be continuous, but may rather form a plurality of discrete, circumferentially-spaced ports.

The grooves 65-74 may be coupled to one or more vacuum sources (not shown), such as via conduits disposed within the sidewall 30 of the transfer shaft 12 and/or in the sidewall 40 of the transfer carriage 16, for example. The vacuum sources may be configured to draw gas into the grooves 65-74. Thus, any air or other gas that may migrate toward the vacuum transfer port 34 of the transfer shaft 12 may be drawn into the grooves 65-74 (see FIG. 2, for example) before it is able to exit the transfer shaft 12. The flow of air into the high vacuum pressure environment 28 is thereby mitigated or entirely prevented.

It will be appreciated that while the illustrated embodiment of the system 10 employs differential pumping regions 37, 39, 58, and 60 to seal the high vacuum pressure environment 28 from the atmospheric pressure environment 24, the air bearing 64, and the intermediate port 36, other sealing devices and arrangements could be additionally or alternatively implemented. For example, it is contemplate that a lip seal arrangement could be used in lieu of, or in addition to, the pumped grooves 65-74. It is further contemplated that the number and positions of the differential pumping regions 58 and 60 and the grooves 68-74 may be varied without departing from the present disclosure.

Figure 3:
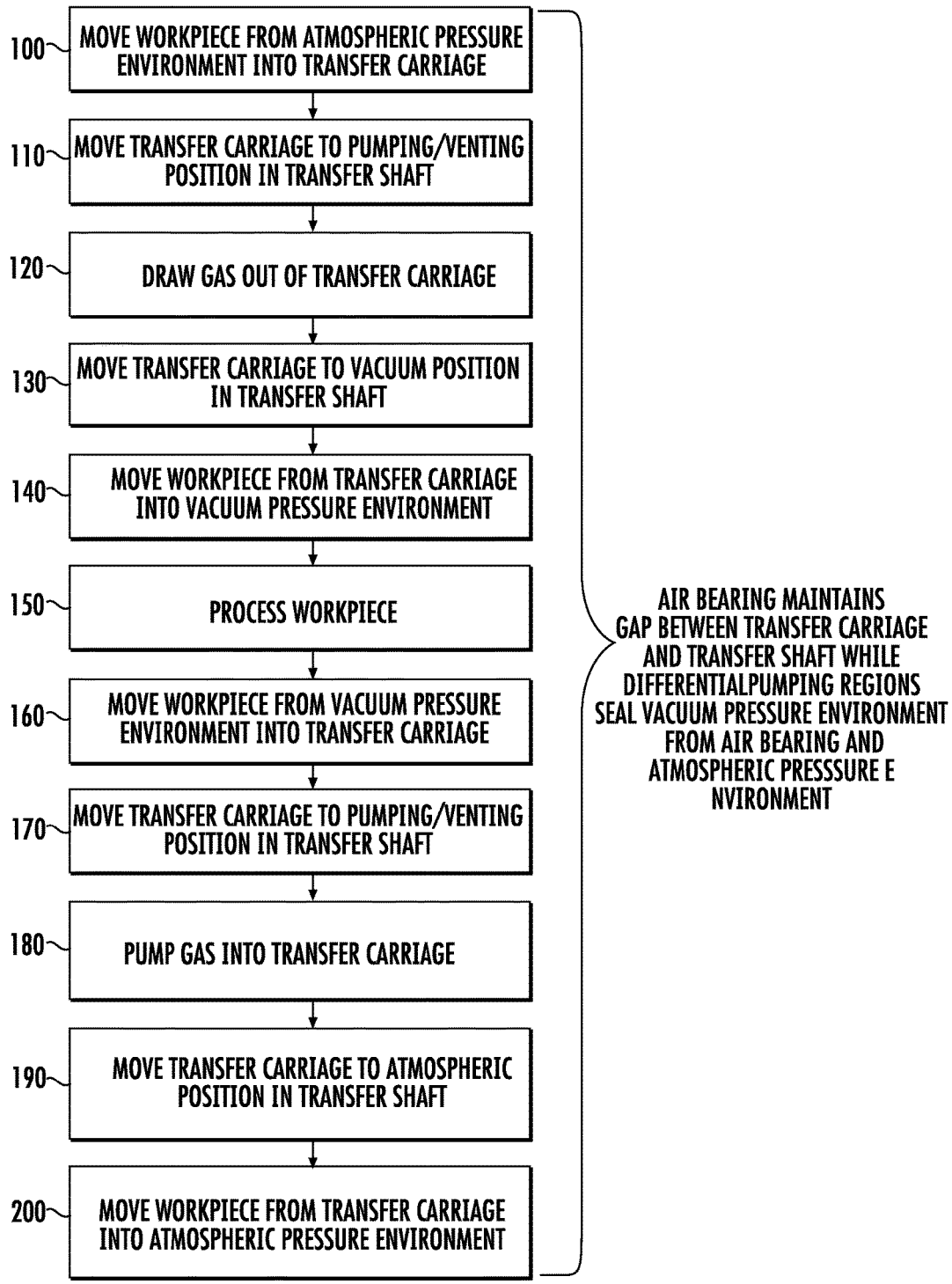
FIG. 3 is a flow diagram illustrating an exemplary method for implementing the exemplary vacuum transfer system shown in FIG. 1.

Referring to FIG. 3, a flow diagram illustrating an exemplary method for operating the system 10 in accordance with the present disclosure is shown. The method will now be described in conjunction with the schematic representations of the system 10 shown in FIGS. 4-9.

At a first step 100 of the exemplary method, with the transfer carriage 16 at the atmospheric position in the transfer shaft 12 (see FIG. 4), a semiconductor workpiece 80 may be moved into the transfer carriage 16 from the atmospheric pressure environment 24 through the atmospheric transfer port 32 of the transfer shaft 12 and the access port 56 of the transfer carriage 16, and may be placed on the workpiece pedestal 46. The semiconductor workpiece 80 may be moved thusly by a robotic arm (not shown) located in the atmospheric pressure environment 24, for example.

Figure 5:
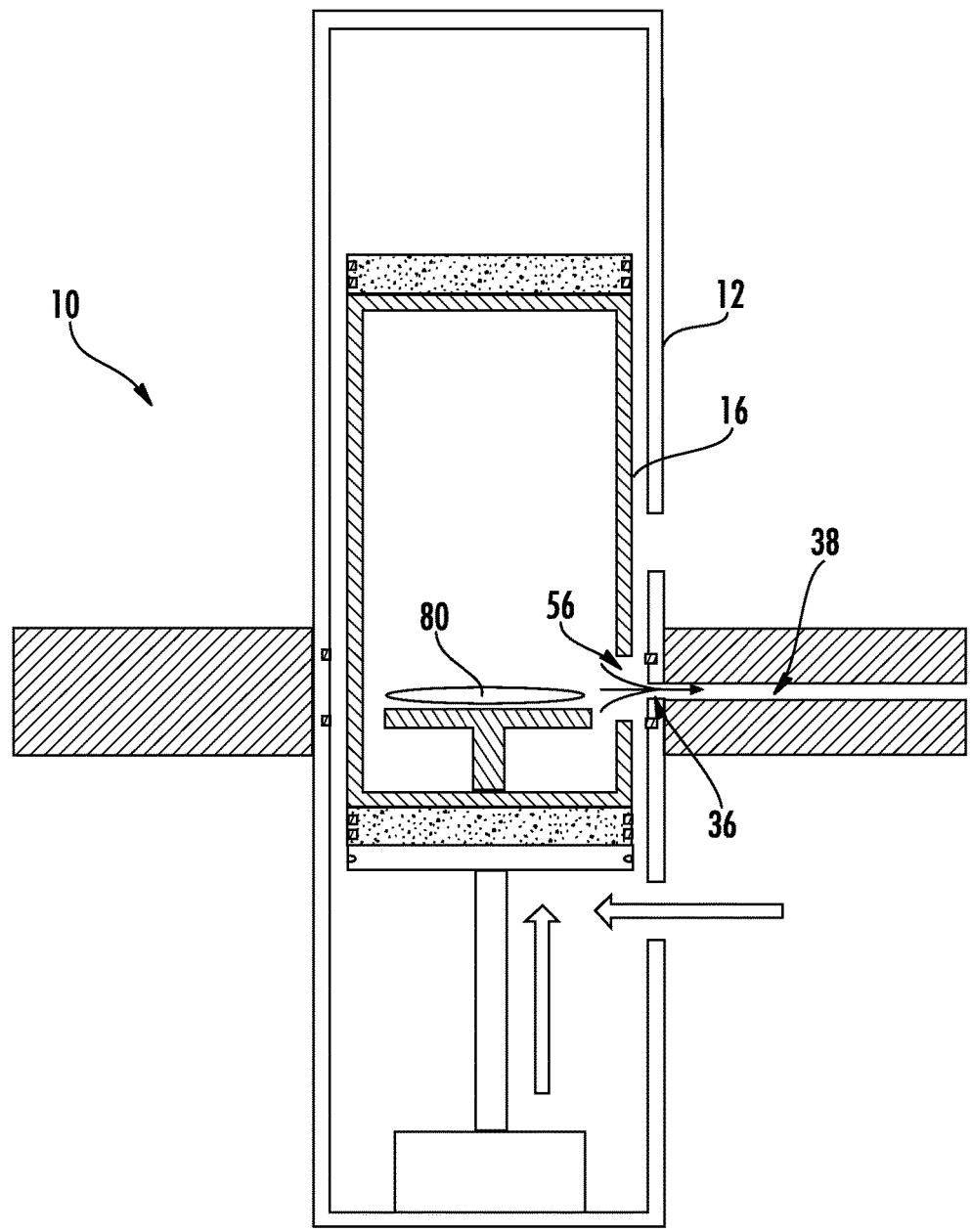

At step 110, the linear actuator 18 may move the transfer carriage 16 upward to the intermediate position in the transfer shaft 12 (see FIG. 5). Positioned thusly, the access port 56 of the transfer carriage 16 may be horizontally aligned with the intermediate port 36 of the transfer shaft 12 and the channel 38 in the wall 20 of the vacuum enclosure 14, thereby placing the interior of the transfer carriage 16 in fluid communication with the channel 38.

At step 120, the vacuum source coupled to the channel 38 may be activated, thereby drawing air out of the transfer carriage 16 through the channel 38 as shown in FIG. 5. The interior of the transfer carriage 16 may thus be pumped down to a high vacuum pressure that is compatible with the high vacuum pressure environment 28 within the vacuum enclosure 14.

Figure 6:
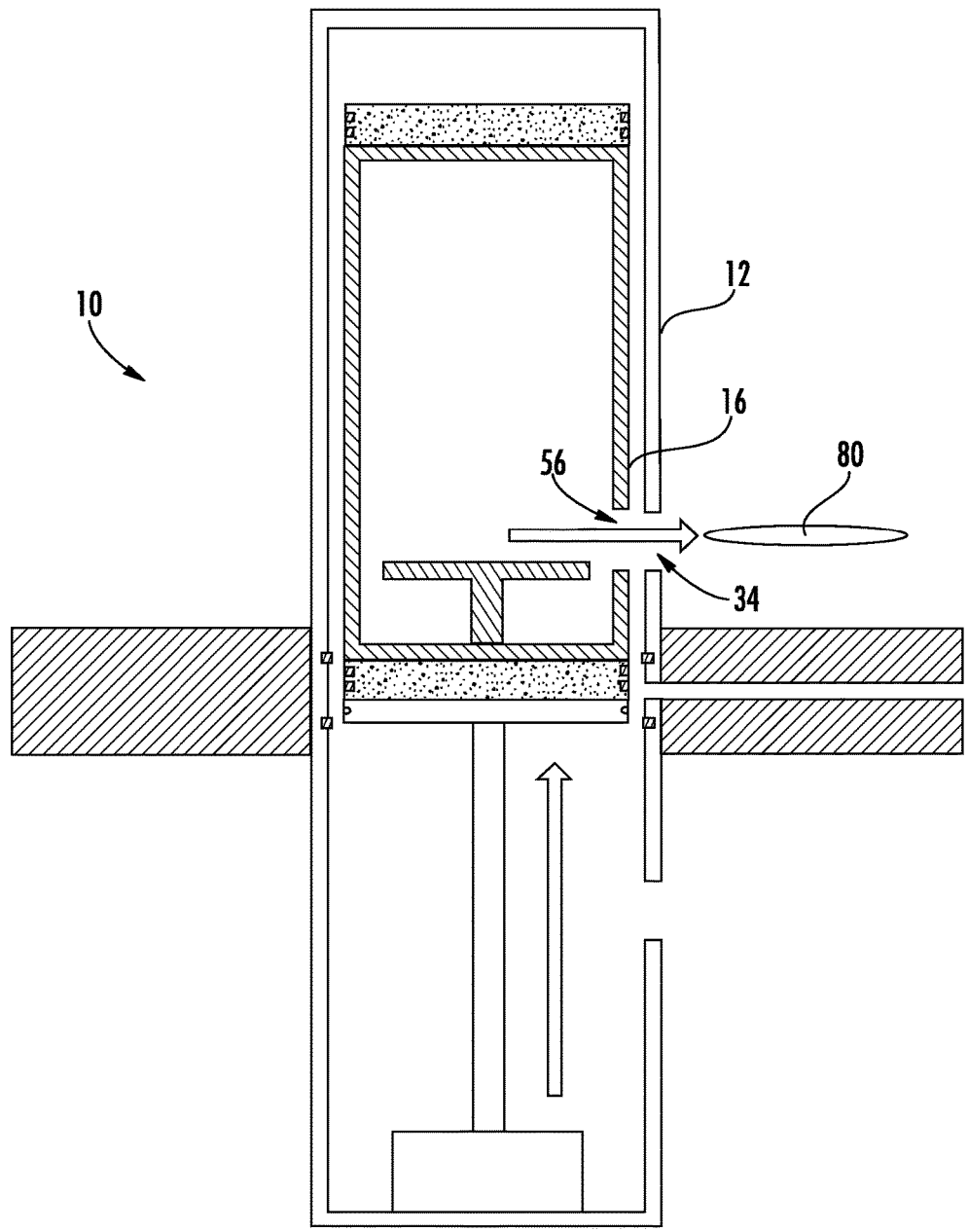

At step 130 of the exemplary method, the linear actuator 18 may move the transfer carriage 16 upwardly to the vacuum position in the transfer shaft 12 (see FIG. 6). The access port 56 of the transfer carriage 16 may thus be moved into horizontal alignment with the vacuum transfer port 34 of the transfer shaft 12, exposing the interior of the transfer carriage 16 to the high vacuum pressure environment 28.

At step 140, the semiconductor workpiece 80 may be picked from the workpiece pedestal 46 and moved into the high vacuum pressure environment 28 through the access port 56 of the transfer carriage 16 and the vacuum transfer port 34 of the transfer shaft 12 (see FIG. 6). The semiconductor workpiece 80 may be moved thusly by a robotic arm (not shown) located in the high vacuum pressure environment 28, for example. The semiconductor workpiece 80 may then, at step 150, be subjected to one or more processes (e.g., ion implantation) within the high vacuum pressure environment 28.

Figure 7:
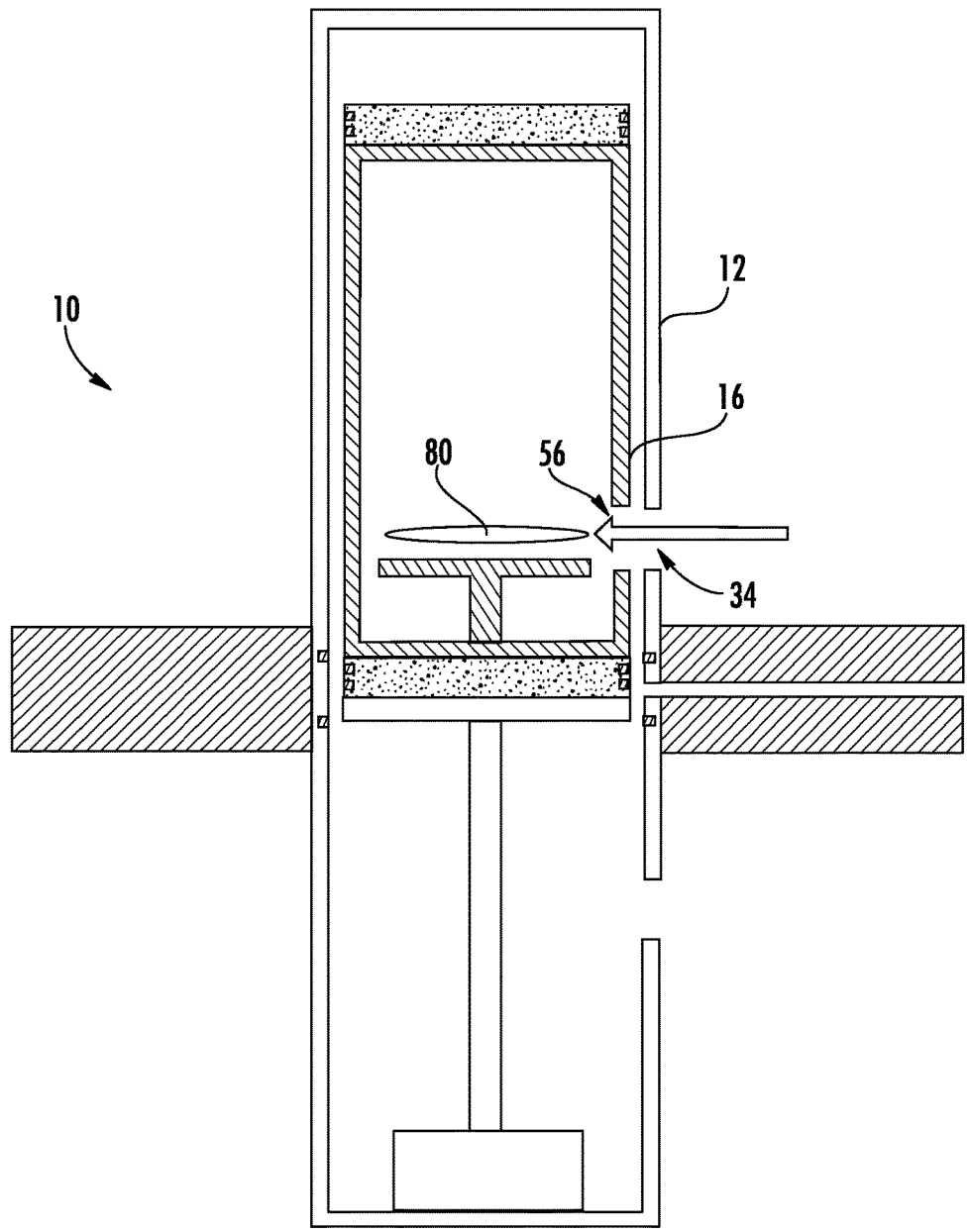

After processing, the semiconductor workpiece 80 may, at step 160, be moved back into the transfer carriage 16 from the high vacuum pressure environment 28 through the vacuum transfer port 34 of the transfer shaft 12 and the access port 56 of the transfer carriage 16, and may be placed back on the workpiece pedestal 46 (see FIG. 7).

At step 170, the linear actuator 18 may move the transfer carriage 16 downward to the intermediate position in the transfer shaft 12 (see FIG. 8), again moving the access port 56 of the transfer carriage 16 into horizontally alignment with the intermediate port 36 of the transfer shaft 12 and the channel 38 in the wall 20 of the vacuum enclosure 14.

Figure 8:
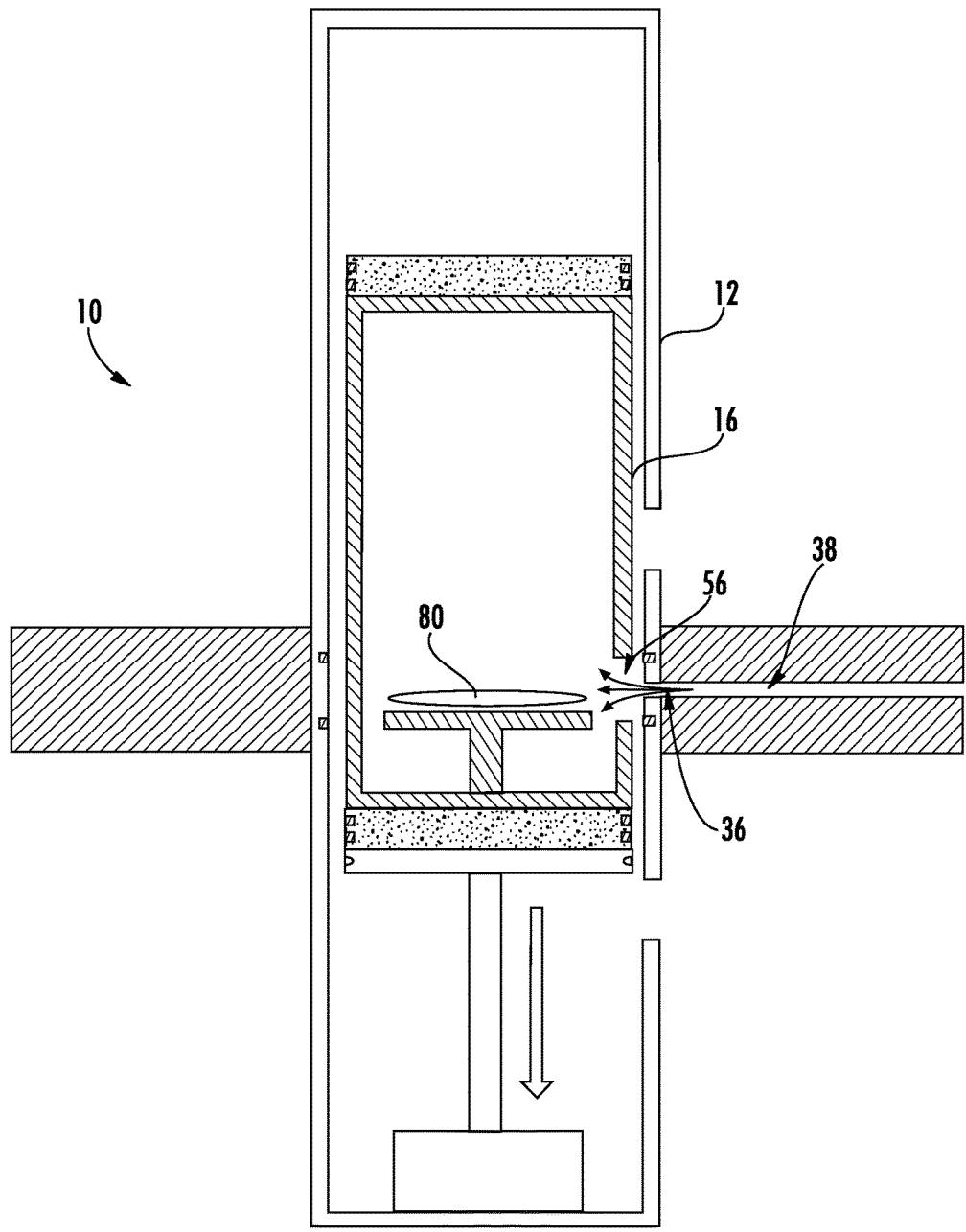

At step 180, the air source coupled to the channel 38 may admit air into of the transfer carriage 16 through the channel 38 (see FIG. 8). The interior of the transfer carriage 16 may thus be brought to a pressure approaching or equal to the pressure of the atmospheric pressure environment 24.

Figure 9:
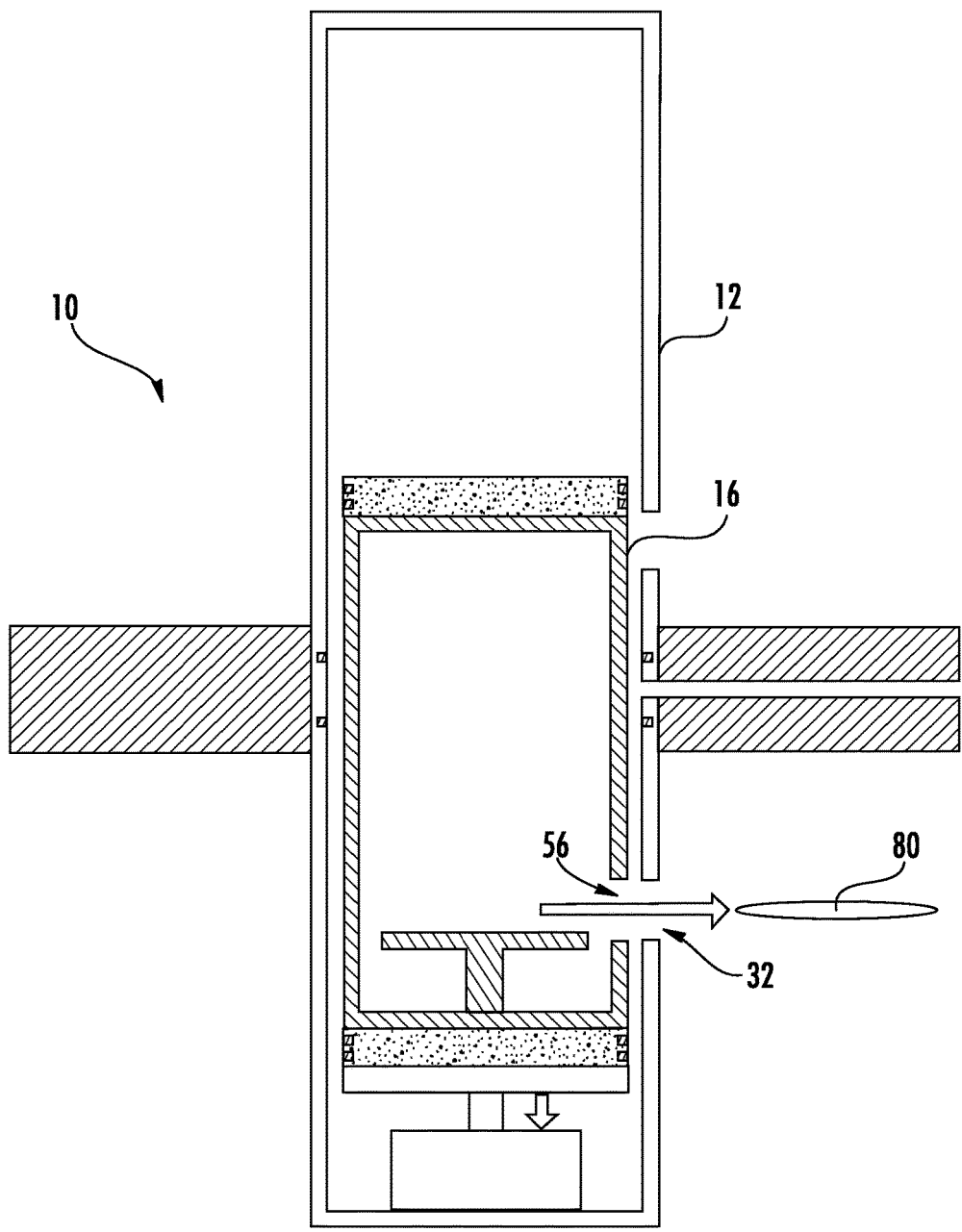

At step 190, the linear actuator 18 may move the transfer carriage 16 downwardly to the atmospheric position in the transfer shaft 12, as shown in FIG. 9. The access port 56 of the transfer carriage 16 may thus be moved into horizontal alignment with the atmospheric transfer port 32 of the transfer shaft 12, exposing the interior of the transfer carriage 16 open to the atmospheric pressure environment 24.

At step 200, the semiconductor workpiece 80 may be picked from the workpiece pedestal 46 and moved into the atmospheric pressure environment 24 through the access port 56 of the transfer carriage 16 and the atmospheric transfer port 32 of the transfer shaft 12 (see FIG. 9). The semiconductor workpiece 80 may then be passed along for further processing or collection.

After the semiconductor workpiece 80 is removed from the transfer carriage 16 in step 200, or while the semiconductor workpiece 80 is being processed in the high vacuum pressure environment 28 in step 150, another workpiece may be transferred from the atmospheric pressure environment 24 to the high vacuum pressure environment 28 as described steps 100 through 140 described above, and may eventually be transferred back to the atmospheric pressure environment 24 as described in steps 150 through 200 above.

Thus, all semiconductor workpieces that are transferred into and out of the high vacuum pressure environment 28 by the system 10 are exposed to substantially identical environmental conditions. Moreover, the air bearing 64 of the system 10 minimizes the presence of contaminants that could otherwise result from engagement between the transfer carriage 16 and the transfer shaft 12, while the differential pumping regions 37, 39, 58, and 60 seal the high vacuum pressure environment 28 from gas that may migrate from the air bearing 64 and the atmospheric pressure environment 64. It will therefore be appreciated that the system 10 provides enhanced consistency among semiconductor workpieces, as well as generally cleaner semiconductor workpieces, relative to other transfer systems and configurations.

As used herein, an element or step recited in the singular and proceeded with the word "a" or "an" should be understood as not excluding plural elements or steps, unless such exclusion is explicitly recited. Furthermore, references to "one embodiment" of the present invention are not intended to be interpreted as excluding the existence of additional embodiments that also incorporate the recited features.

While certain embodiments of the disclosure have been described herein, it is not intended that the disclosure be limited thereto, as it is intended that the disclosure be as broad in scope as the art will allow and that the specification be read likewise. Therefore, the above description should not be construed as limiting, but merely as exemplifications of particular embodiments. Those skilled in the art will envision other modifications within the scope and spirit of the claims appended hereto.

The invention claimed is:

1. A system for transferring articles between an atmospheric pressure environment and a vacuum pressure environment, the system comprising:
    a vacuum enclosure including a wall separating the atmospheric pressure environment from the vacuum pressure environment;
    a transfer shaft extending through the wall from the atmospheric pressure environment to the vacuum pressure environment, the transfer shaft having an atmospheric transfer port in communication with the atmospheric pressure environment, a vacuum transfer port in communication with the vacuum pressure environment, and an intermediate port disposed in communication with a channel in the wall;
    a transfer carriage disposed within the transfer shaft, the transfer carriage having an access port for providing access to an interior of the transfer carriage, the transfer carriage being movable within the transfer shaft;

a first differential pumping region formed in the wall on a first side of the channel and a second differential pumping region formed in the wall on a second side of the channel opposite the first side, each of the first and the second differential pumping regions comprising a groove configured to draw gas out of a space between the transfer carriage and the transfer shaft; and an air bearing associated with the transfer carriage, the air bearing configured to maintain a gap between the transfer carriage and the transfer shaft.

2. The system of claim 1, wherein the transfer carriage is movable between an atmospheric position in which the access port of the transfer carriage is aligned with the atmospheric transfer port of the transfer shaft, an intermediate position in which the access port of the transfer carriage is aligned with the intermediate port of the transfer shaft, and a vacuum position in which the access port of the transfer carriage is aligned with the vacuum transfer port of the transfer shaft.

3. The system of claim 1, the transfer carriage further including a third differential pumping region formed in the transfer carriage and comprising a groove configured to draw gas out of a space between the transfer carriage and the transfer shaft.

4. The system of claim 3, wherein the groove of the third differential pumping region comprises a continuous, annular channel formed in an exterior of the transfer carriage.

5. The system of claim 2, wherein the groove comprises a continuous, annular channel formed in an interior of the transfer shaft.

6. The system of claim 1, further comprising a linear actuator disposed within the transfer shaft and configured to move the transfer carriage between several predetermined positions within the transfer shaft.

7. The system of claim 6, wherein the intermediate port is configured to draw gas out of the transfer carriage when the transfer carriage is in an intermediate position.

8. The system of claim 6, wherein the intermediate port is configured to pump gas into the transfer carriage when the transfer carriage is in an intermediate position.

9. The system of claim 1, wherein the air bearing comprises a plurality of air outlets through which the pressurized gas is expelled into a space between the transfer carriage and the transfer shaft.

10. A system for transferring articles between an atmospheric pressure environment and a vacuum pressure environment, the system comprising:

a transfer shaft extending between the atmospheric pressure environment and the vacuum pressure environment, the transfer shaft having an intermediate port disposed in communication with a channel in a wall separating the atmospheric pressure environment from the vacuum pressure environment;

a transfer carriage disposed within the transfer shaft, the transfer carriage having an access port for providing access to an interior of the transfer carriage;

a first differential pumping region formed in the wall on a first side of the channel and a second differential pumping region formed in the wall on a second side of the channel opposite the first side, each of the first and the second differential pumping regions comprising a groove configured to draw gas out of a space between the transfer carriage and the transfer shaft; and an air bearing mounted to the transfer carriage and configured to expel pressurized gas into a space between the transfer shaft and the transfer carriage for maintaining a gap between the transfer carriage and the transfer shaft.

11. The system of claim 10, wherein the transfer carriage is movable between an atmospheric position in which the access port of the transfer carriage is aligned with an atmospheric transfer port of the transfer shaft, an intermediate position in which the access port of the transfer carriage is aligned with the intermediate port of the transfer shaft, and a vacuum position in which the access port of the transfer carriage is aligned with a vacuum transfer port of the transfer shaft.

12. The system of claim 10, further comprising a third differential pumping region formed in the transfer carriage, the third differential pumping region comprising a groove configured to draw gas out of the transfer shaft.

13. The system of claim 10, further comprising a linear actuator disposed within the transfer shaft and coupled to the transfer carriage.

14. The system of claim 10, wherein the air bearing is configured to expel gas radially outwardly from the transfer carriage.

* * * * *